(12) United States Patent
Kawai

(10) Patent No.: US 6,195,155 B1
(45) Date of Patent: Feb. 27, 2001

(54) SCANNING TYPE EXPOSURE METHOD

(75) Inventor: Hidemi Kawai, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/418,204

(22) Filed: Oct. 13, 1999

Related U.S. Application Data

(63) Continuation of application No. 08/839,821, filed on Apr. 18, 1997.

(51) Int. Cl.[7] .......................... G03B 27/42; G03B 27/52; G03B 27/54
(52) U.S. Cl. .................................. 355/53; 355/67; 355/55
(58) Field of Search .................................. 355/52, 53, 55, 355/67, 71; 356/399–401; 430/5, 22; 250/548, 559.27

(56) References Cited

U.S. PATENT DOCUMENTS

| | | | |
|---|---|---|---|
| 5,627,627 | * 5/1997 | Suzuki | ..................... 355/68 |
| 5,699,145 | * 12/1997 | Makinouchi et al. | ................. 355/53 |
| 5,796,469 | * 8/1998 | Ebinuma | ................. 355/53 |
| 6,078,381 | * 6/2000 | Suzuki | ................. 355/53 |

* cited by examiner

*Primary Examiner*—Russell Adams
*Assistant Examiner*—Hung Henry Nguyen
(74) *Attorney, Agent, or Firm*—Chapman and Cutler

(57) ABSTRACT

A first scanning type exposure method provides for changes in a synchronization settling time in accordance with a sensitivity of a photosensitive substrate, a line width of the mask pattern, or both. The throughput provided by the method can be enhanced while still obtaining the necessary resolution by making the synchronization settling time short when using a mask having a pattern with wide line width or a photosensitive substrate with a high sensitivity. A second scanning type exposure method provides for changes in a margin for synchronization error when starting a transfer of the pattern after completing acceleration of the photosensitive substrate and the mask in accordance with the line width of the mask pattern, the sensitivity of the photosensitive substrate, or both. A reduction in the time until the start of the exposure and an enhancement of the throughput while obtaining the necessary resolution are provided by making the margin of the synchronization error wide when using a mask having a pattern with wide line widths or a photosensitive substrate of high sensitivity. A scanning type exposure device utilizes the first or the second scanning type exposure method by setting a timing for the start of transferring the transfer target mask pattern to the exposure target photosensitive substrate. This timing is set by a transfer start condition read from a storage device in accordance with a line width of multiple mask patterns, the sensitivity of the photosensitive substrate, or both.

27 Claims, 3 Drawing Sheets

SCANNING TYPE EXPOSURE METHOD

This application is a continuation of application Ser. No. 08/839,821, filed Apr. 18, 1997.

BACKGROUND OF THE INVENTION

1. Field of the Invention

The present invention relates to an exposure method and an exposure device for transferring a mask pattern onto a photosensitive substrate during certain photolithographic processes. Such processes are typically used when manufacturing semiconductor devices, image pickup devices (CCDs, etc.), liquid-crystal display elements, thin-film magnetic heads, and so on. The use of such a method and such a process is particularly favorable when a scanning type exposure device, such as step-and-scan system, is used to perform exposure operations.

2. Description of Related Art

It is known, when manufacturing semiconductor devices, to use a reduced projection type exposure device, or stepper, in a step-and-repeat or batch exposure system for transferring a reticle pattern or mask to individual shot areas of a wafer or glass plate forming a photosensitive substrate. A projection exposure device for use in a step-and-scan system has also been proposed. In this type of system, a reduced image of the reticle pattern is successively transferred to each shot area of the wafer by scanning the reticle and wafer synchronously with respect to the projection optical system. In this way, the need for enlarging the area of the transfer target pattern is met.

In a scanning exposure type projection exposure device used in a step-and-scan system, it is necessary to move the wafer stage at a fixed scanning speed $V_w$ during exposure in order to provide a prescribed exposure value with respect to the photoresist on the wafer. It is also necessary to move the reticle stage in the corresponding direction by $XW/\beta$ synchronously with the movement of the wafer stage position XW, where the projection magnification from the reticle of the optical projection system to the wafer is B, in order to keep distortion and resolution of the reticle pattern image on the wafer within a prescribed margin. Therefore, the scanning speed of the reticle stage becomes $V_w/\beta$ when the scanning speed of the wafer stage is $V_w$.

FIG. 6 shows the change in speed V of the wafer stage with respect to time t when executing exposure in the one shot area with a projection exposure device for a step-and-scan system. In FIG. 6, the wafer stage is accelerated from rest to a scanning speed $V_w$ within an acceleration time TA. The positional misregistration of the reticle and wafer is held to a prescribed margin within the subsequent synchronous settling time TB. Exposure is executed by irradiating illuminating light during the next exposure time TC.

Assuming that the aforementioned acceleration time is designated TA, the exposure time is designated TC, the average time necessary for stepping between the shot areas and deceleration of the wafer stage is a shot processing time designated TS, and the loading time of the wafer is a wafer processing time designated TL, then the throughput, or exposure wafer count per unit time, N may be expressed as $$N = C / \{n \times (TA + TB + TC + TS) + TL\} \quad (1)$$

In this equation, C is the unit time and n is the shot area count per wafer. It is apparent from equation (1) that the throughput N improves by reducing the exposure time TC during which illuminating light is actually irradiated on each shot area.

In the scanning exposure system mentioned above, the throughput N can be improved by reducing the actual exposure time TC in each shot area of the wafer. However, an inability to enhance throughput (N) to a desired level has existed since the scanning speed has had an upper limit determined by the wafer and the reticle stages.

When an exposure time with respect to any arbitrary point on the wafer is designated $T_w$, the necessary exposure value of the photoresist on the wafer is designated E (mJ/cm$^2$), the scanning speed of the wafer stage is designated $V_w$ (mm/sec), the maximum value of the scanning speed thereof is $V_{Wmax}$, the slit width, in the scanning direction, of the slit shaped exposure field on the wafer is designated D, and the illumination intensity within the exposure field is designated P (mW/cm$^2$), the following relationship must be established.

$$T_w = E/P = D/V_w \geq V_{Wmax} \quad (2)$$

If the slit width D is considered to be a fixed value in order to satisfy equation (2), then it is necessary to increase a scanning speed $V_w$ when the resist sensitivity is high and the necessary exposure value E is low. On the other hand, it is necessary to decrease the scanning speed $V_w$ when the resist sensitivity is low and the necessary exposure value E is high. The scanning speed $V_w$, however, cannot exceed the maximum value $V_{wmax}$ obtained by the mechanism. When the resist sensitivity is a prescribed high sensitivity and the necessary exposure value E becomes a prescribed value $E_{sa}$, the scanning speed $V_w$ reaches its maximum value $V_{wmax}$. For example, when the maximum value of an illumination intensity P is $P_{max}$, the prescribed value $E_{sa}$ of the necessary exposure value E can be described as $$E_{sa} = P_{max} \cdot D / V_{Wmax} \quad (3)$$

The scanning speed $V_w$ is fixed at a maximum value ($V_{wmax}$) when the resist sensitivity is high and the necessary exposure value E is less than a prescribed value $E_{sa}$. It is necessary, therefore, to reduce the illumination intensity P in order to satisfy equation (2) and obtain the necessary exposure value. When the scanning speed $V_w$ is fixed at the maximum value ($V_{wmax}$), the exposure time $T_w$ to one arbitrary point on the wafer is fixed at $D/V_{Wmax}$ according to equation (2). The actual exposure time (TC) with respect to each shot area in equation (1) is fixed at a given minimum value, and the throughput (N) reaches an upper limit.

FIG. 7 shows the relationship of the throughput to the resist sensitivity. The horizontal axis in FIG. 7 is the necessary exposure value E (mJ/cm$^2$) of the photoresist and the vertical axis is the throughput N (in arbitrary units) obtained from equation (1). FIG. 7 shows that the throughput N is high until the necessary exposure value E reaches the prescribed value $E_{sa}$. Throughput N remains at a fixed value N1 during this time. The throughput N gradually decreases when the necessary exposure value E is above the prescribed value $E_{sa}$. Therefore, the throughput, up to a given level, during the exposure process of the semiconductor element cannot be improved when using a photoresist of high sensitivity.

The sensitivity and the resolution oppose each other so that as the sensitivity becomes higher, the resolution becomes lower. In the layers of the semiconductor device, a photoresist of high resolution and low sensitivity is used in what is referred to as the "critical layer". The critical layer is a layer in the semiconductor device in which the superimposition precision of the pattern is rigorous and the minimum line width is, for example, 0.3 μm. A photoresist of low resolution and high sensitivity is used in another layer, referred to as the "noncritical layer", in which the minimum line width is greater than 0.5 μm and the superimposition precision of the pattern is relatively relaxed. When a photoresist of high sensitivity and large line width is used, an upper limit in the throughput is created.

SUMMARY OF THE INVENTION

One object of the present invention is to provide a scanning type exposure method taking the factors mentioned above into consideration and which can enhance the throughput of the exposure process by synchronously scanning the reticle and the wafer.

Another object of the present invention is to provide a scanning type exposure device that can use this type of exposure method.

A first scanning type exposure method according to the present invention is a scanning type exposure method which successively transfers and exposes a mask pattern onto a photosensitive substrate by moving the scanning mask and the photosensitive substrate synchronously and projecting one part of the pattern formed on the mask onto the photosensitive substrate. A synchronous settling time, which is the time from completion of acceleration of the mask and the photosensitive substrate until a start of a transfer of the mask pattern onto the photosensitive substrate, is switched in accordance with the sensitivity of the photosensitive substrate, the line width of the mask pattern, or both.

According to the present invention, the synchronization settling time until the start of the transfer or, more specifically, the time required to set the relative positional misregistration (synchronization error) between the mask and the photosensitive substrate at a prescribed value, is reduced if the line width of the mask pattern is large or if the sensitivity of the photosensitive substrate is high when exposing a noncritical layer. Consequently, the time necessary for the exposure is reduced and the throughput of the exposure process is improved. The necessary superimposition precision and resolution are relatively relaxed in the noncritical layer so that the necessary precision is obtained even when the synchronization settling time is reduced.

On the other hand, when the line width of the mask pattern is small or the sensitivity of the photosensitive substrate is low, as is the case when exposing a critical layer, the synchronization settling time is set long as in the conventional technology. Consequently, the necessary resolution and so on can be obtained. The necessary resolution is maintained, and the throughput can be enhanced, by changing the synchronization settling time in accordance with the particular layer involved.

A second scanning type exposure method according the present invention is similar to first scanning type exposure method and includes varying the margin for the synchronization error between the mask and the photosensitive substrate in accordance with the sensitivity of the photosensitive substrate, the line width of the mask pattern or both, when starting a transfer of the mask pattern onto the photosensitive substrate, by accelerating the mask and the photosensitive substrate.

According to the present invention, the margin for the synchronization error is set to be wide when the sensitivity of photosensitive substrate is high or the line width of the mask pattern is large, as is the case in the noncritical layer. The margin for the synchronization error, however, is set to be narrow when the sensitivity of the photosensitive substrate is low or the line width of the mask pattern is small, as is the case in the critical layer. Consequently, the throughput is improved as a whole while obtaining the necessary superimposition precision in accordance with the layer criticality.

The scanning type exposure device according to the present invention is provided with mask stages that scan a mask formed with a transfer pattern and substrate stages which scan a photosensitive substrate by synchronizing movements with those of the mask stages. The mask pattern is successively transferred and exposed onto a photosensitive substrate by synchronously scanning the mask and the photosensitive substrate via the mask and substrate stages where one part of the mask pattern is projected onto the photosensitive substrate. A storage device is provided which stores the transfer start condition (which may be, for example, either a synchronization setting time or a margin for synchronization error) in accordance with the sensitivity of multiple photosensitive substrates, the line widths of multiple mask patterns, or both, when starting a transfer of the mask pattern onto the photosensitive substrate. A control device is provided which sets the timing for starting the transfer of the transfer target mask pattern onto the exposure target photosensitive substrate. This timing is set on the basis of the transfer start condition read from the storage device according to the sensitivity of the exposure target photosensitive substrate, the line width of the transfer target mask pattern, or both, after starting the acceleration of the mask and substrate stages.

The first and second scanning type exposure methods can be used by changing the transfer start condition in accordance with the layer exposed.

DESCRIPTION OF THE PREFERRED EMBODIMENTS

The first application example of the present invention is illustrated in FIGS. 1–4. In this example, the present invention is used when exposure is performed with a projection exposure device of a stop-and-scan system.

Figure 1:
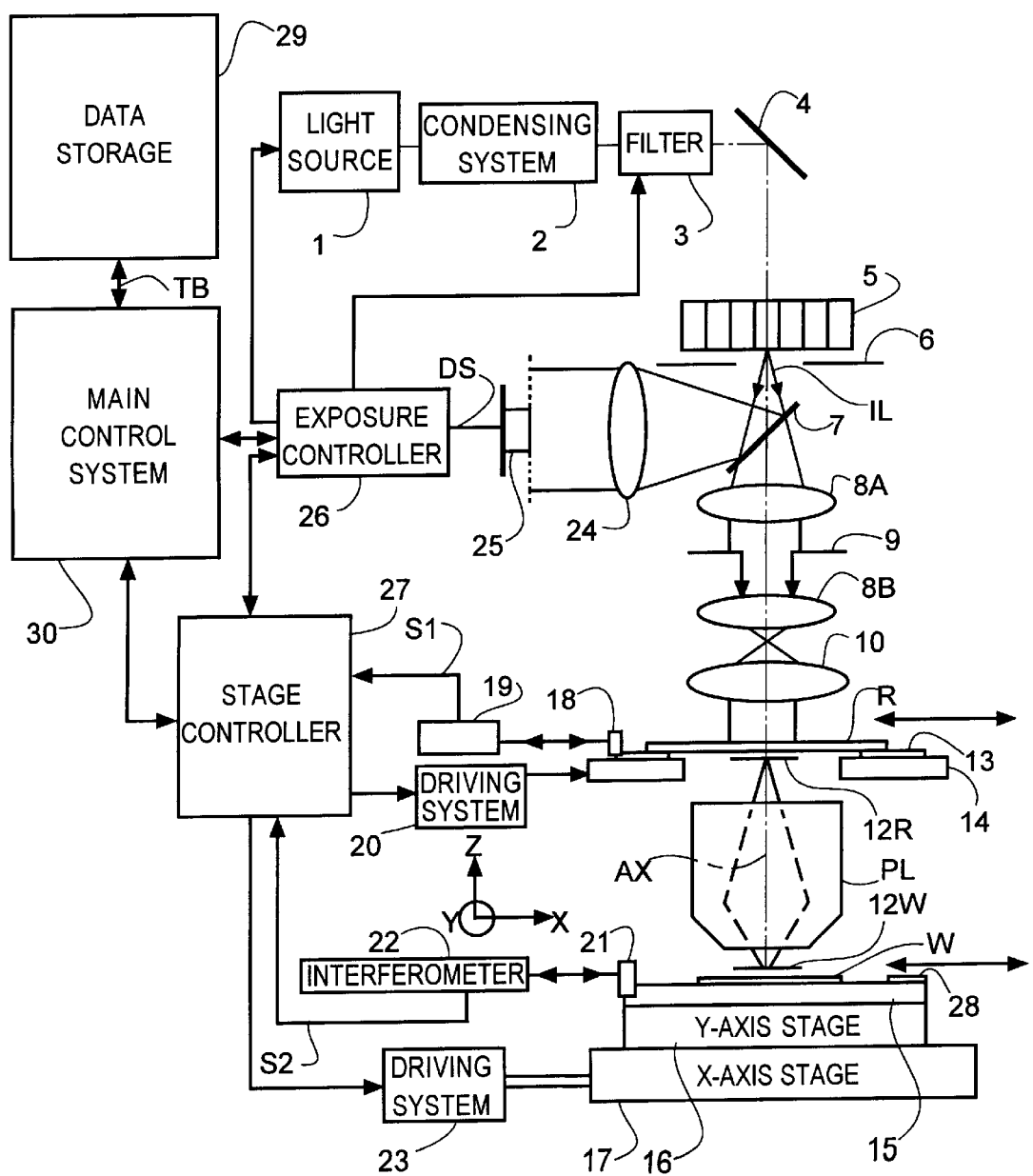
FIG. 1 is a view of a projection exposure device according to the present invention.

FIG. 1 is a block diagram showing a projection exposure device of this example. In FIG. 1, illuminating light IL, such as i-line light (wavelength 365 nm) generated from an exposure light source 1 composed of an ultrahigh-pressure mercury lamp, is incident on a fish or fly eye lens 5. The lens 5 uniformly distributes the illumination intensity via a luminous flux condensing system 2, such as a collimator lens, a variable extinction filter system 3 composed, for example, of an ND filter of various transmittances, and a mirror 4 for reflecting the luminous flux. A shutter that opens and closes the optical path of the illuminating light IL is arranged in a luminous flux condensing system 2. The higher harmonics of a YAG laser, a metal vapor laser beam, or a laser beam of an ArF excimer laser, a KrF excimer laser, etc., can be used to provide illuminating light for exposure instead of or in addition to the luminescent line of the mercury lamp.

Illuminating light IL output from the fly eye lens 5 passes through an aperture diaphragm (σ contraction) 6. The illuminating light illuminates a rectangular illumination area 12R on the pattern area of the reticle with a uniform distribution of illumination intensity via a beam splitter 7 having a high transmittance and a low reflectivity, a first relay lens 8A, a field diaphragm (reticle blind) 9, a second relay lens 8B, and a main condenser lens 10.

On the basis of the illuminating light IL, the pattern within the illumination area 12R of the reticle is reduced by a projection magnification β (β is for example, ¼, ⅕, etc.) via a projection optical system PL. The projection optical system is telecentric to both sides (or at least to the wafer W side). The projection is exposed onto a rectangular exposure area 12W of the wafer W. A fixed-sensitivity photoresist is coated onto the surface of the wafer W. An explanation will now be given with respect to the direction parallel to the optical axis AX of the projection optical system PL (the Z axis), the direction parallel to the surface of the paper in FIG. 1 in a plane perpendicular to the Z axis (the X axis), and the direction perpendicular to the surface of the paper in FIG. 1 (the Y axis). In this example, the direction along the X axis (X direction) is the scanning direction of the reticle R and the wafer W during exposure.

The luminous flux in one part of the illuminating light IL reflected by the beam splitter 7 is incident on an integrator sensor 25 composed of a photoelectric detector after passing through a condensing optical system 24. The photoelectric conversion signal DS output from the integrator sensor 25 is fed to an exposure controller 26. The illumination intensity target value of the illuminating light IL for providing a suitable exposure value for the photoresist on the wafer W is input to the exposure controller 26 from the main control system 30. The main control system comprehensively controls the entire device. The exposure controller 26 controls the extinction rate of the variable extinction filter system 3 and the brightness of the exposure light source 1 so that the measured value of the photoelectric conversion signal DS complies with the target value. The exposure controller also controls the opening and the closing of the shutter within luminous flux condensing system 2.

The driving system for the reticle R and the wafer W will now be explained. The reticle stage 13 is mounted on a reticle support stand 14. The reticle R is adhered to and held on the reticle stage 13. The reticle stage 13 is constructed to move at a high speed in the X direction on the reticle support stand 14 in accordance with, for example, a linear motor system. The reticle stage 13 also moves in slow motion in the X direction, the Y direction, and the rotational direction. The X position, the Y position, and the rotational angle of the reticle stage 13 are monitored by a movable mirror 18 on the reticle stage 13 and an external laser interferometer 19. Position information S1 relating to the reticle stage 13 and, therefore, of the reticle R, obtained with a laser interferometer 19, is fed to a stage controller 27. The stage controller 27 controls the position and speed of the reticle stage 13 via a driving system 20 based on input position information S1.

Each reticle is stored respectively in one of multiple reticle cases within a reticle library (not shown in the figure). The reticle appropriate for each layer on the wafer is selected and loaded onto the reticle stage 13 via a reticle loader (not shown in the figure) according to instructions from the main control system 30.

The wafer X axis stage 17 is loaded on a fixed disc (not shown in the figure). The wafer Y axis stage 16 is loaded on the wafer X axis stage so that it can be stepped in the Y direction. The wafer holder 15 is loaded on top of the wafer Y axis stage, and the wafer W is adhered to and held on the wafer holder 15. A Z stage for positioning the wafer W in the Z direction and a θ stage for adjusting the rotational angle of the wafer are integrated into the wafer holder 15. The position in the X direction, the position in the Y direction, and the rotational angle of the sample stand 15 are monitored by the movable mirror 21 on the wafer holder 15 and an externally arranged laser interferometer 22. Position information S2 relating to the wafer holder 15 and, therefore, to the wafer W, obtained from the laser interferometer 22, is fed to the stage controller 27. The stage controller 27 controls the position and speed of the wafer Y axis stage 16 and the wafer X axis stage 17 via the driving system 23 on the basis of input position information S2.

A reference mark unit 28 is formed with a reference mark, etc., for aligning the wafer W and the reticle R. The reference mark unit is also attached on the wafer holder 15. Although it is not shown in FIG. 1, an alignment system for detecting the positional relationship of each shot area of the wafer W and the reticle R is also provided. In this example, the positional relationship between each shot area and the projected image of the reticle R is measured in the alignment process prior to starting the scan exposure of each shot area of the wafer W.

A data storage part 29 is connected to the main control system 30 in this example. Synchronization settling time TB data of the stage, corresponding to the sensitivity, etc., of the photoresist on the wafer or the minimum line width of the reticle, are stored in the data storage part 29. In the main control system 30, the corresponding synchronization settling time TB data are read from the data storage part 29 during the exposure.

The basic operation of this example when executing a scan exposure will now be explained.

The illumination intensity of the illuminating light IL for providing a suitable exposure with respect to the photoresist on the wafer W and the scanning speed $V_w$ in the X direction of the wafer W (the speed of the wafer X axis stage 17) are set with the main control system 30. The illumination intensity and scanning speed ($V_w$) set are fed, respectively, to the exposure controller 26 and the stage controller 27.

Figure 6:
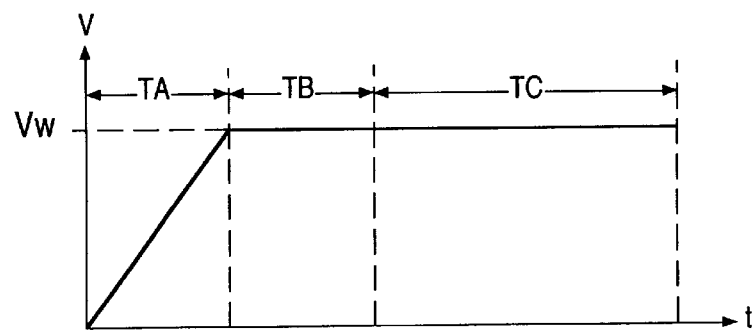
FIG. 6 shows a change in speed of the wafer stage when exposing a one shot area with the scan exposure system.
Figure 7:
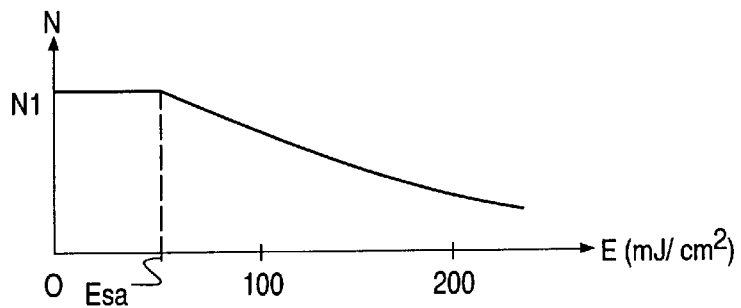
FIG. 7 shows a relationship between the throughput and the necessary exposure value of the photoresist.

As shown in FIG. 6, the speed, in the X direction, of the wafer holder 15 and, therefore, the wafer W is accelerated from 0 to the scanning speed $V_w$ in an acceleration time TA. This acceleration is performed by driving the wafer X axis stage 17. The reticle stage 13 is also accelerated by being coupled therewith. The positional misregistration between the wafer W and the reticle R is adjusted within the synchronization settling time TB. If the X coordinates of the wafer holder 15 and the reticle stage 13 are, for example, 0 when the exposure target shot areas of the wafer W and the reticle R were positioned, then the stage position is controlled so that the X coordinate $X_R$ of the reticle stage 13 with respect to the X coordinate $X_W$ of the wafer holder 15 during the scan exposure becomes $-X_W/\beta$. In this relationship, $\beta$ is the projection magnification of the projection optical system PL. The position code is reversed due to the projection of a reverse image according to the projection optical system PL. Synchronization error ($\Delta X$) in the X direction of the wafer W and the reticle R is expressed as follows.

$$\Delta X = X_R = (-X_w/\beta) = X_R + X_w/\beta \quad (4)$$

There is also a synchronization error in the Y direction, which is vertically oriented relative to the scanning direction and the rotational direction. The synchronization error in the Y direction, however, is small compared to the synchronization error in the X direction. An explanation of the Y direction synchronization error, therefore, will be omitted here. The wafer X axis stage 17 is driven at a scanning speed $V_w$ in order to approach the target value of the synchronization error $\Delta X$ in equation 4 to within the synchronization settling time TB as in FIG. 6. Here, the target value is 0. When the synchronization error $\Delta X$ is 0 and the wafer X axis stage 17 is moved in the +X or −X direction at a scanning speed $V_w$, the reticle stage 13 is scanned in the −X direction (or +X direction) at a scanning speed $V_w/\beta$. It is possible to drive the wafer X axis stage 17 by synchronization with the scanning of reticle stage 13.

After the synchronization settling time TB has lapsed, the exposure controller 26 shown in FIG. 1 begins to irradiate illuminating light IL. The pattern image of the reticle R is successively exposed in each relevant shot area on wafer W within the exposure time TC represented in FIG. 6.

There is a mechanically determined upper limit to the scanning speed in the X direction of the wafer X axis stage 17 and the reticle stage 13. The projection magnification $\beta$ of this example, however, is a reduction magnification (e.g., ¼, ⅕, etc.), so the scanning speed in the X direction of the reticle stage 13 is expanded by a magnification of $1/\beta$ (e.g., magnification of 4, magnification of 5, etc.) when compared to scanning speed $V_w$ of the wafer X axis stage 17 during the scan exposure. Therefore, as one example, the upper limit to the scanning speed of the reticle stage 13 becomes the mechanical upper limit value. The maximum value $V_{Wmax}$ of the scanning speed $V_w$ of the wafer X axis stage 17 is a magnification factor on the order of $\beta$ of the scanning speed upper limit for the reticle stage 13.

In this example, the synchronization settling time TB is changed in accordance with the minimum line width of the pattern transferred onto the wafer W. This principle will be explained with reference to FIGS. 2 and 3.

Figure 2A:
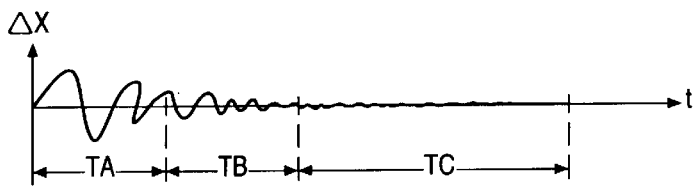
FIG. 2(a) shows a synchronization error of a wafer and a reticle during a scan exposure in a first application example of the present invention.

FIG. 2(a) shows one example of synchronization error $\Delta X$ (the error expressed by equation (4)) corresponding to acceleration time TA, synchronization settling time TB, and exposure time TC in FIG. 6. The synchronization error (AX) converges more or less in the vicinity of 0 within the synchronization settling time TB and is maintained more or less in the vicinity of 0 within the exposure time TC.

Figure 2B:
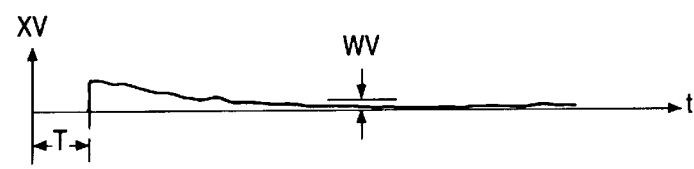
FIG. 2(b) shows a variance for prescribed synchronization error times.
Figure 2C:
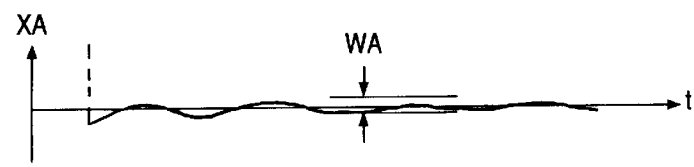
FIG. 2(c) shows an average value at each of the prescribed synchronization error times.

The result of the computation of the variance XV of synchronization error $\Delta X$ in FIG. 2(a) within time T before each sampling time is shown in FIG. 2(b). The time necessary for one point on wafer W to pass the width, in the scanning direction, of the exposure area 12W on the wafer W in FIG. 1 is designated T. The result of the computation of the average value XA of the synchronization error $\Delta X$ within a time T before each sampling time is shown in FIG. 2(c).

The variance XV of the synchronization error in FIG. 2(b) corresponds to the resolution of the pattern image transferred onto the wafer W. The resolution, therefore, is unfavorable in an area with a large variance XV and, accordingly, the picture quality degrades. On the other hand, the average value XA of the synchronization error in FIG. 2(c) corresponds to the distortion in the pattern image transferred onto the wafer W. Distortion in an area with a large average value XA is unfavorable and the fluctuation in the image position becomes large. The superimposition error is unfavorable when carrying out a superimposed exposure.

The allowable range (hereafter referred to as the "window width") of the average value XA and the variance XV of the synchronization error is determined according to the layer on the wafer W. Within the exposure time TC in FIG. 2(a), it is necessary to keep the variance XV of the synchronization error within the window width WV (refer to FIG. 2(b)). The window width is determined according to the resolution needed. It is also necessary to keep the average value XA within the window width WA (refer to FIG. 2(c)), which is determined according to the distortion characteristic needed. As is apparent from FIG. 2(a), the variance XV of the synchronization error $\Delta X$ and the average value XA gradually decrease within the synchronization settling time TB. It is possible, therefore, to make the window width WA have average value XA and the window width WV have a narrow variance XV when the synchronization settling time TB is made long.

Figure 3:
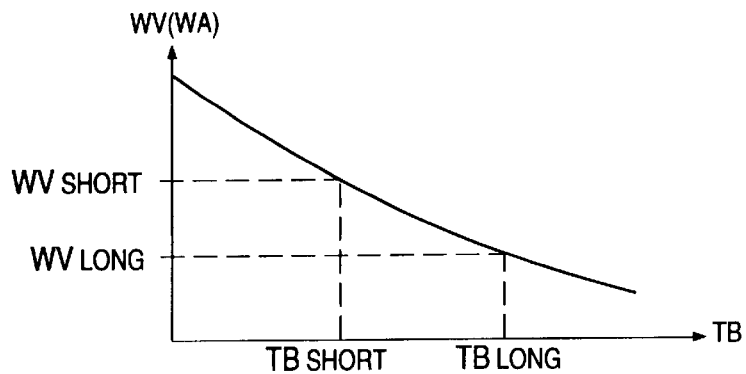
FIG. 3 shows the relationship between a synchronization settling time and a window width of the synchronization error.

FIG. 3 shows the relationship between a settable window width WV or WA and the synchronization settling time TB. The horizontal axis in FIG. 3 represents the synchronization settling time TB, and the vertical axis represents the window width WV for the variance XV (resolution) of synchronization error $\Delta X$. When the vertical axis is the window width WA for the average value XA (distortion) of synchronization error $\Delta X$, the same tendency is manifested. As shown in FIG. 3, the settable window width (WV) increases and the resolution of the transferred pattern degrades as the synchronization settling time TB becomes shorter. Similarly, the settable window width WA increases and the resolution in the transferred pattern degrades as the synchronization settling time TB becomes shorter.

When the window width for the variance XV of the synchronization error $\Delta X$ necessary in the critical layer (the layer with a minimum line width of 0.3 µm requiring high superimposition precision) is $WV_{long}$ and the window width of the variance XV necessary in the noncritical layer (the layer with a minimum line width of over 0.5 µm and in which the superimposition precision can also be low) is $WV_{short}$, the synchronization settling time TB necessary to obtain the window widths becomes $TB_{long}$ and $TB_{short}$ ($<TB_{long}$), respectively.

When the minimum line width of the pattern transferred onto the wafer in the noncritical layer is the threshold value $L_{th}$, the synchronization settling time TB is set to be greater than $TB_{long}$ with respect to a layer with a narrower minimum line width than the threshold value $L_{th}$. The synchronization settling time TB is set to be less than $TB_{short}$ with respect to a layer with a minimum line width greater than the threshold value $L_{th}$. The threshold value $L_{th}$ of the minimum line width and the synchronization settling times $TB_{long}$ and $TB_{short}$ are stored in the data storage part 29 of FIG. 1. In the main control system 30, the minimum line width L for the projected image of the reticle pattern on the wafer is obtained from the exposure data for the reticle R before exposure. The synchronization settling time $TB_{long}$ is set in storage controller 27 when the minimum line width L is narrower than the threshold value $L_{th}$. The synchronization settling time $TB_{short}$ is set when the minimum line width L is more than the threshold value ($L_{th}$). Also, as was already explained, the throughput N of the exposure process is defined as follows using the aforementioned acceleration time TA, synchronization settling time TB, exposure time TC, shot processing time TS, wafer processing time TL, shot area count n, and unit time C.

$$N=C/\{n\times(TA+TB+TC+TS)+TL\} \quad (5)$$

Therefore, the throughput N improves when the synchronization settling time TB is reduced to $TB_{short}$ in the noncritical layer.

Figure 4A:
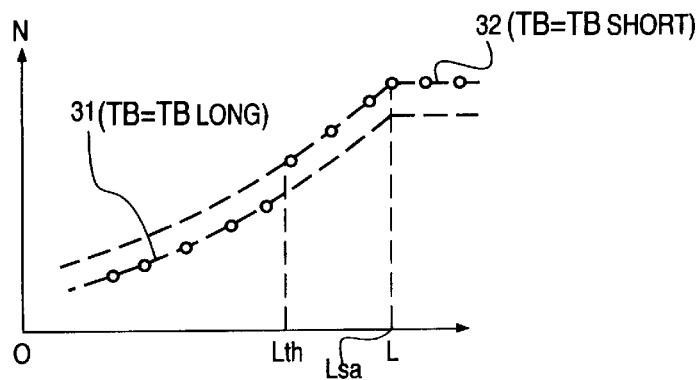
FIG. 4(a) shows the relationship between a throughput and the minimum line width according to the first application example.

FIG. 4(a) shows the relationship between the throughput N and the minimum line width L when exposure is performed with the scan exposure system of this example. In FIG. 4(a), the curve 31 is the throughput N when the synchronization settling time TB is set at $Tb_{long}$. The curve 32 is the throughput N when the synchronization settling time TB is set at $TB_{short}$. The necessary resolution also normally becomes low when the minimum line width L increases so that the sensitivity of the photoresist on wafer W can be increased. The necessary exposure value E, in other words, can be made low. The throughput N in FIG. 4(a) is the result of a computation that makes the sensitivity of the photoresist high when the minimum line width (L) increases.

When the minimum line width L increases as noted above, the scanning speed $V_w$ of the wafer W can be increased. As a result, the exposure time TC during which illuminating light is irradiated is reduced, and the throughput N is enhanced in accordance with equation (5). However, the scanning speed $V_w$ has an upper limit, so that curves 31 and 32, indicating the throughput N, show saturation when the minimum line width L reaches the prescribed width $L_{sa}$. The synchronization settling time TB used is differentiated at the threshold value $L_{th}$ as the boundary of the minimum line width L. The throughput N, therefore, is represented by the curve 31 in a range in which the minimum line width L is narrower than the threshold value $L_{th}$ (the range from the critical layer to the noncritical layer). The throughput N in the noncritical layer with a minimum line width L greater than the threshold value $L_{th}$ is represented by the curve 32 and is enhanced.

The synchronization settling time TB is typically less than one second. The synchronization settling time TB, however, is reduced for each of the many exposures to the many shot areas on wafer W, so that the throughput improves greatly as a whole.

The synchronization settling time TB is set in two steps in this example. However, the synchronization settling time TB can be set continuously with respect to the minimum line width L.

Figure 4B:
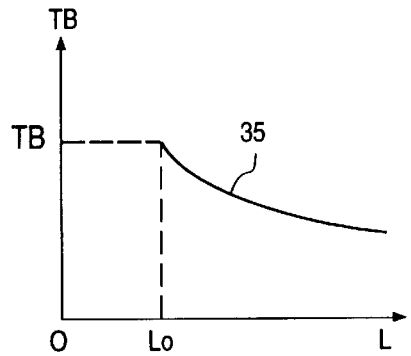
FIG. 4(b) shows a situation in which the synchronization settling time is changed more or less continuously with respect to the minimum line width.

FIG. 4(b) shows an example of continuously changing the synchronization settling time TB. In FIG. 4(b), the synchronization settling time TB is set to $TB_0$ when the minimal line width L is a line width $L_0$ in the critical layer. The synchronization settling time TB gradually becomes shorter, as indicated with a curve 35, as the minimum line width L becomes wider. The slope of this curve 35 should be the same as the slope for the curve represented in FIG. 3. By continuously changing the synchronization settling time TB, it is possible to obtain the necessary resolution and distortion characteristics in each layer and to maximally enhance the respective throughput.

It is possible to set the synchronization settling time TB according to the window width WA for the distortion or the window width WV for the resolution necessary in the relevant layer by directly utilizing the relationship in FIG. 3 instead of setting the synchronization settling time TB based on the minimum line width L. In this case, storage in the data storage part 29 is according to the corresponding synchronization settling time TB and the window width WA of the distortion or the window width WV of the resolution.

Next, the second application example of the present invention will be explained with reference primarily to FIG. 5. The first application example switched the synchronization settling time in accordance with the minimum line width. In this example, however, the synchronization settling time is switched in accordance with the sensitivity (the necessary exposure value E) of the photoresist on the wafer. In this example, exposure is also carried out by the projection exposure device of the step-and-scan system represented in FIG. 1.

This example also utilizes the fact that the window width WV for the variance XV (resolution) of the settable synchronization error ΔX and the window width WA for the average value XA (distortion) of the synchronization error ΔX have an inverse proportional relationship with respect to the synchronization settling time TB during the scan exposure as shown in FIG. 3. Furthermore, considering the fact that the resolution decreases when the sensitivity of the photoresist is enhanced, a photoresist having a sensitivity complying with the resolution (or distortion) necessary in the exposure target layer is used. The synchronization settling time TB is changed in accordance with the sensitivity of the photoresist (the necessary exposure value E).

As an example, the synchronization settling time TB is set greater than $TB_{long}$ for a layer with a necessary exposure value E larger than the threshold value $E_{th}$. The synchronization settling time TB is set less than $TB_{short}$ for a layer with a necessary exposure value E less than the threshold value $E_{th}$ if the necessary exposure value E of the photoresist used in the noncritical layer is the threshold value $E_{th}$. These threshold values $E_{th}$ of the necessary exposure value E and the synchronization settling times $TB_{long}$ and $TB_{short}$ are stored in the data storage part 29 of FIG. 1. In the main control system 30, the necessary exposure value E of the photoresist on the wafer W is checked in accordance with the exposure data prior to the exposure. The synchronization settling time $TB_{long}$ is set at the stage controller 27 when the necessary exposure value E is greater than the threshold value $E_{th}$. The synchronization settling time $TB_{short}$ is set when the necessary exposure value E is less than the threshold value $E_{th}$.

Figure 5:
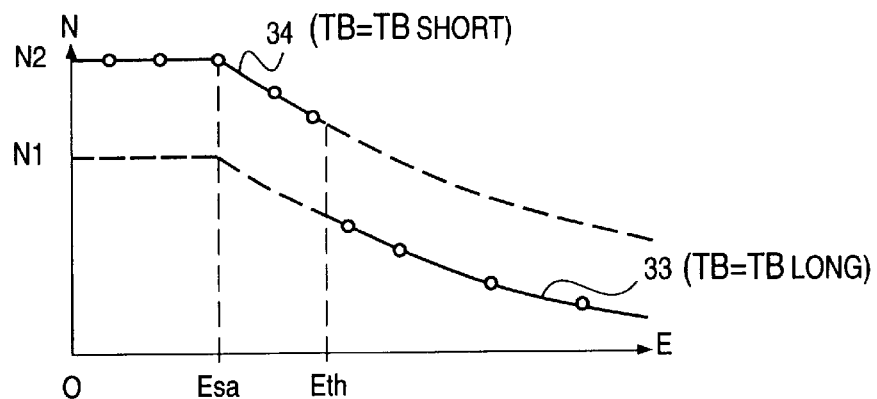
FIG. 5 shows the throughput as it relates to a necessary exposure value of the photoresist in a second application example of the present invention.

FIG. 5 shows the relationship between the throughput N and the necessary exposure value E (resist sensitivity) of the photoresist when exposure is performed with the scan exposure system in this example. In FIG. 5, a curve 33 represents the throughput N when the synchronization settling time TB is set to $TB_{long}$. The curve 34 represents the throughput N when the synchronization settling time TB is set to $TB_{short}$. The throughput N improves in accordance with both curves 33 and 34 when the necessary exposure value E decreases and saturates at N1 and N2, respectively, when the necessary exposure value E reaches the prescribed value $E_{th}$. The use of the synchronization settling time TB is differentiated in this example with the threshold value $E_{th}$ as the boundary in the necessary exposure value E. The throughput N is represented by the curve 33 in a range of necessary exposure values E greater than the threshold value $E_{th}$ (the range from the critical layer to the noncritical layer). The throughput N in the noncritical layer with a necessary exposure value E of less than the threshold value $E_{th}$ is represented by the curve 34 on the high side. Therefore, the throughput in the noncritical layer is enhanced, and the throughput is improved when using a high sensitivity resist with a low necessary exposure value E.

In this example, it is also possible to set the synchronization settling time TB continuously with respect to the necessary exposure value E. In this case, the synchronization settling time TB is made long in accordance with a gradual increase in the necessary exposure value E when the synchronization settling time TB is $T_1$ and the necessary exposure value E is the minimum value Ea.

In the aforementioned application example, the synchronization settling time TB is changed in accordance with the layer. As is apparent from FIG. 3, the window width WA for the average value XA (distortion) of the synchronization error ΔX and the window width WV for the variance XV (resolution) of the settable synchronization error ΔX become narrow as the synchronization settling time TB becomes long. This is apparent both theoretically and experimentally. The control system starts exposure when the prescribed synchronization settling time TB lapses. Therefore, the scanning exposure system is able to set a short co-scan distance during the scan exposure and use a simple arithmetic process in its control system.

The present invention is not limited to the application examples described above and can be composed in various ways within a scope not deviating from the essence of the present invention.

What is claimed is:

1. A scanning type exposure method comprising the steps of:

scanning a mask pattern and a photosensitive substrate synchronously where one part of the pattern formed on the mask is projected onto the photosensitive substrate to successively transfer and expose the mask pattern onto the photosensitive substrate, and changing a synchronization settling time from completion of acceleration of said mask pattern and the photosensitive substrate until a start of transfer of the mask pattern to the photosensitive substrate in accordance with a sensitivity of the photosensitive substrate, a line width of the mask pattern, or both said sensitivity and said line width.

2. A method as defined in claim 1, wherein the step of changing the synchronization settling time includes increasing the synchronization settling time when the mask pattern is transferred onto a critical layer of said photosensitive substrate.

3. A method as defined in claim 1, wherein the step of changing the synchronization settling time includes decreasing the synchronization settling time when the mask pattern is transferred onto a non-critical layer of said photosensitive substrate.

4. A method as defined in claim 2, and further comprising the step of determining a layer of said photosensitive substrate to be said critical layer when said line width is approximately 0.3 µm.

5. A method as defined in claim 3, and further comprising the step of determining a layer of said photosensitive substrate to be said non-critical layer when said line width is over 0.5 µm.

6. A method as defined in claim 1, wherein the step of changing the synchronization settling time includes increasing the synchronization settling time when said sensitivity is low and a necessary exposure value for said photosensitive substrate is greater than a threshold value.

7. A method as defined in claim 1, wherein the step of changing the synchronization settling time includes decreasing the synchronization settling time when said sensitivity is high and a necessary exposure value for said photosensitive substrate is less than a threshold value.

8. A scanning type exposure method comprising the steps of:

scanning a mask pattern and a photosensitive substrate synchronously where one part of the pattern formed on the mask is projected onto the photosensitive substrate to successively transfer and expose the mask pattern onto the photosensitive substrate, and changing a margin for a synchronization error for the mask pattern and the photosensitive substrate when starting the transfer of said mask pattern to said photosensitive substrate, by accelerating said mask pattern and said photosensitive substrate, according to a sensitivity of the photosensitive substrate, a line width of the mask pattern, or both said sensitivity and said line width.

9. A method as defined in claim 8, wherein the step of changing the margin includes decreasing the margin when the mask pattern is transferred onto a critical layer of said photosensitive substrate.

10. A method as defined in claim 8, wherein the step of changing the margin includes increasing the margin when the mask pattern is transferred onto a non-critical layer of said photosensitive substrate.

11. A method as defined in claim 9, and further comprising the step of determining a layer of said photosensitive substrate to be said critical layer when said line width is approximately 0.3 µm.

12. A method as defined in claim 10, and further comprising the step of determining a layer of said photosensitive substrate to be said non-critical layer when said line width is over 0.5 µm.

13. A method as defined in claim 8, wherein the step of changing the margin includes decreasing the margin when said sensitivity is low and a necessary exposure value for said photosensitive substrate is greater than a threshold value.

14. A method as defined in claim 8, wherein the step of changing the margin includes increasing the margin when said sensitivity is high and a necessary exposure value for said photosensitive substrate is less than a threshold value.

15. A scanning type exposure device comprising:

mask stages which scan a mask formed with a mask pattern, substrate stages which scan a photosensitive substrate by synchronizing with said mask stages, the mask pattern being successively transferred to and exposed onto the photosensitive substrate by synchronously scanning the mask and the photosensitive substrate via said mask stages and substrate stages where one part of the mask pattern is projected onto the photosensitive substrate, a storage means for storing a transfer start condition in accordance with sensitivities of multiple photosensitive substrates, pattern line widths of multiple masks, or both the sensitivities and pattern line widths when starting to transfer the mask pattern onto the photosensitive substrate, and a control means for setting a timing for starting to transfer the mask pattern onto the photosensitive substrate on the basis of the transfer start condition read from the storage means according to a sensitivity of the photosensitive substrate, a line width of the mask pattern, or both said sensitivity and said line width after starting acceleration of the mask stages and the substrate stages.

16. A scanning type exposure device as defined in claim 15, wherein said transfer start condition is a synchronization settling time.

17. A scanning type exposure device as defined in claim 16, wherein said storage means outputs a larger synchronization settling time when the mask pattern is transferred onto a critical layer of said photosensitive substrate.

18. A scanning type exposure device as defined in claim 17, wherein a layer of said photosensitive substrate is said critical layer when said line width is approximately 0.3 $\mu$m.

19. A scanning type exposure device as defined in claim 15, wherein said transfer start condition is a margin for synchronization error.

20. A scanning type exposure device as defined in claim 19, wherein said storage means outputs a larger margin when said sensitivity is high and a necessary exposure value for said photosensitive substrate is less than a threshold value.

21. An exposure apparatus which exposes a pattern of a mask onto a substrate, comprising:
   a movable mask stage to hold the mask;
   a movable substrate stage to hold the substrate;
   a stage controller connected to said movable mask stage and said movable substrate stage to synchronously move the mask and the substrate;
   a synchronization error detector connected to said movable mask stage and said movable substrate stage to detect a synchronization error between said mask and said substrate; and
   a controller having a data storing device, which stores at least one of a sensitivity of the substrate and the pattern,
   wherein an exposure condition is changed based on an output from said data storing device and a detection result of said synchronization error detector, and said exposure condition includes at least one of a margin for the synchronization error between said mask and said substrate and a synchronization settling time from completion of acceleration of the mask and the substrate.

22. An exposure apparatus according to claim 21, wherein the controller changes a margin for the synchronization error in accordance with the output from said data storing device.

23. An exposure apparatus according to claim 21, wherein the synchronization error detector is connected to said movable mask stage and said movable substrate stage optically.

24. An exposure apparatus according to claim 23, wherein the synchronization error detector comprises an interferometer.

25. A substrate with a mask pattern transferred by the method according to claim 1.

26. A substrate with a mask pattern transferred by the method according to claim 8.

27. An exposure apparatus according to claim 21, wherein said data storing device stores a line width of the pattern.

* * * * *